United States Patent [19]

Yamazaki et al.

[11] Patent Number: 4,707,192

[45] Date of Patent: Nov. 17, 1987

[54] NICKEL-BASE SINGLE CRYSTAL SUPERALLOY AND PROCESS FOR PRODUCTION THEREOF

[75] Inventors: Michio Yamazaki, Zushi; Toshihiro Yamagata, Yokohama; Hiroshi Harada, Koganei, all of Japan

[73] Assignee: National Research Institute for Metals, Tokyo, Japan

[21] Appl. No.: 15,531

[22] Filed: Feb. 12, 1987

Related U.S. Application Data

[63] Continuation of Ser. No. 704,094, Feb. 22, 1985, abandoned.

[30] Foreign Application Priority Data

Feb. 23, 1984 [JP] Japan .................................. 59-31424

[51] Int. Cl.$^4$ ................................................. C22F 1/10
[52] U.S. Cl. ........................................ 148/3; 148/162; 148/404; 148/410
[58] Field of Search .................... 148/404, 410, 162, 3

[56] References Cited

U.S. PATENT DOCUMENTS 4,116,723 9/1978 Gell et al. ........................... 148/404

*Primary Examiner*—R. Dean
*Attorney, Agent, or Firm*—Wenderoth, Lind & Ponack

[57] ABSTRACT

A nickel-base single crystal superalloy having high creep rupture strength at high temperatures, said superalloy being obtained by subjecting a single crystal alloy having a composition consisting essentially of, by weight,
Cr 4.5–10%,
W 7.5–20%,
Al 4.5–6%,
Ta 2–12%,
Co 5–10%,
Ni substantially being the balance,
W+Ta=17–24%,
to a solutionizing treatment, an air cooling treatment and an aging treatment; and a process for producing the same.

24 Claims, No Drawings

NICKEL-BASE SINGLE CRYSTAL SUPERALLOY AND PROCESS FOR PRODUCTION THEREOF

This application is a continuation of now abandoned Ser. No. 704,094 filed Feb. 22, 1985.

BACKGROUND OF THE INVENTION

1. Field of the Invention

This invention relates to a nickel-base single crystal superalloy having high creep rupture strength at high temperatures, and to a process for its production. In particular, the invention relates to a nickel-base single crystal superalloy having high creep rupture strength at high temperatures which is suitable for use as a material for gas turbine blades in jet engines, power plants, etc.

2. Description of the Prior Art

Various technological fields now demand superalloys having high strength at elevated temperatures. For example, the output and thermal efficiency of gas turbines used in jet engines, power plants, etc. can be most effectively increased by elevating the temperature of the combustion gas, and for this purpose, blade materials having high creep rupture strength at high temperatures have been sought.

For many years, conventionally cast nickel-base superalloys having equiaxed grains have been used as superalloys having high creep rupture strength at elevated temperatures. Since, however, the conventionally cast nickel-base superalloys undergo grain boundary cracking in a direction perpendicular to their stress axis, there is a limit to the magnitude of their creep rupture strength at high temperatures. Methods have been developed to reduce grain boundary cracking perpendicular to the stress axis by adding grain boundary strengthening elements such as carbon, boron and zirconium, and resulted in some increase in creep rupture strength. With these methods, however, it has been impossible to prevent fully the grain boundary cracking in a direction perpendicular to the stress axis.

The directional solidification technique adapted to achieve the absence of a grain boundary perpendicular to the stress axis was developed in the early 1960's. Columnar grains obtained from a polycrystal alloy by using this technique were free from a grain boundary perpendicular to the stress axis and had greatly increased strength at high temperatures, but suffered from the defect of undergoing cracking along their grain boundaries during casting. This defect was later remedied by the addition of hafnium, and many columnar grained alloys, such as PWA 1422, have been developed and come into commercial acceptance since then.

J. J. Jackson et al. found that the creep properties of the directionally solidified alloy PWA 1422 could be greatly improved by solution heat treatment [J. J. Jackson et al., Met. Trans., 8A (1977), 1615]. Since, however, this alloy contains grain boundary strengthening elements, there was a limit in raising the solution temperature. This was because incipient melting occurred in the alloy at relatively low temperatures owing to the presence of the grain boundary strengthening elements. Thus, single crystal alloys which do not require grain boundary strengthening elements, namely contain no grain boundary have been developed.

Alloy 454 (a product of United Technologies Corporation) is one nickel-base single crystal superalloy now in practical use, and Alloy 203E (a product of United Technologies Corporation) and NASAIR 100 (a product of AiResearch Manufacturing Co.) are also investigated for practical application.

The present inventors, to the best of their knowledge, believe that these three single crystal alloys are closest to the single crystal alloy of the present invention in view of their creep rupture strengths at high temperatures.

Alloy 454 is a nickel-base single crystal superalloy disclosed in U.S. Pat. No. 4,209,348 and has a composition consisting of, by weight, 10% Cr, 4% W, 12% Ta, 5% Al, 1.5% Ti and 5% Co and the balance being Ni. The U.S. patent compares the creep rupture characteristics of alloy 454 with those of a commercial nickel-base columnar grained superalloy, PWA 1422, obtained by a prior art technique and containing Hf, C, B and Zr as grain boundary strengthening elements, and states: "Referring to Table II, it is apparent that under the test conditions employed, the invention alloy (454) was superior to the other alloys tested including SM 200, SM 200 (No, B, Zr), 444 and PWA 1422". The alloy composition of PWA 1422 containing grain boundary strengthening elements, as described in the above U.S. patent, consists of, by weight, 9% Cr, 12.0% W, 5% Al, 2.0% Ti, 10% Co, 2.0% Hf, 0.11% C, 0.015% B, 1.0% Cb, 0.10% Zr and the balance being Ni.

The alloys claimed in U.S. Pat. No. 4,209,348 including alloy 454 contain about 1 to about 2% of Ti and as small as about 3 to about 5% of W.

Alloy 203E mentioned above is a nickel-base single crystal superalloy described in U.S. Pat. No. 4,222,794 and has a composition consisting of, by weight, 5.0% Cr, 1.1% Ti, 2.0% Mo, 5.0% W, 3.0% Re, 6.5% Ta, 5.5% Al, 0.4% V and Ni being the balance. This U.S. patent compares the creep properties of Alloy 203E with those of known Alloy 454 and PWA 1422 in Table IV, and states: "Table IV shows that under test conditions of 1800° F. and a 36 Ksi applied load Alloy 203 displays more than twice the performance of Alloy 454 and more than 8 times the life of Alloy 1422 in terms of time to 1% creep." Alloy 203E contains as many as 8 elements including expensive Re in addition to Ni, but the content of W is only 5%.

NASAIR 100 is a single crystal alloy having a composition consisting of, by weight, 9.0% Cr, 1.0% Mo, 10.5% W, 5.75% Al, 1.2% Ti, 3.3% Ta, <0.01% C and the balance being Ni as indicated in T. E. Strangman, G. S. Hoppin III, C. M. Pipps, K. Harris, and R. E. Schwer, "Development of Exothermically Cast Single Crystal Mar-M247 and Derivative Alloys", pp. 215–224 in Proceedings of the 4th International Symposium on Superalloys, "Superalloys '80", Sept. 21-25, 1980, Seven Springs, Pa., U.S.A. Thus, NASAIR 100 is a nickel-base single crystal superalloy containing Mo and Ti as essential ingredients.

The three nickel-base single crystal superalloys considered to be closest to the alloy of this invention have higher creep rupture strengths at high temperatures than conventional other alloys, but the strengths at high temperatures of these three single crystal alloys are not entirely satisfactory for gas turbine uses. It is still desired in the art therefore to develop superalloys having higher strengths at high temperatures.

SUMMARY OF THE INVENTION

It is an object of this invention to provide a nickel-base single crystal superalloy having excellent creep rupture strength at high temperatures.

Another object of this invention is to provide a nickel-base single crystal superalloy having a high solution temperature and wide solution heat-treatment ranges, "windows".

Still another object of this invention is to provide a nickel-base single crystal superalloy of a simple composition with a relatively small number of alloy elements.

A further object of the invention is to provide a nickel-base single crystal superalloy free from a expensive element such as rhenium as an alloy element.

These objects are achieved in accordance with this invention by a nickel-base single crystal superalloy having high creep rupture strength at high temperatures, said superalloy being obtained by subjecting a single crystal alloy having a composition consisting essentially of, by weight, Cr 4.5-10%,
W 7.5-20%,
Al 4.5-6%,
Ta 2-12%,
Co 5-10%,
Ni substantially being the balance,
W+Ta=17-24%,
W+Ta+Cr=22-30%, to a solutionizing treatment, an air cooling treatment and an aging treatment.

An aditional object of this invention is to provide a process for producing a nickel-base single crystal suepralloy in accordance with this invention.

This object is achieved in accordance with this invention by a process for producing a nickel-base single crystal superalloy, which comprises directionally solidifying a material having a composition consisting essentially of, by weight, Cr 4.5-10%,
W 7.5-20%,
Al 4.5-6%,
Ta 2-12%,
Co 5-10%,
Ni substantially being the balance,
W+Ta=17-24%,
W+Ta+Cr=22-30%, to form a single crystal alloy, heating the single crystal alloy to a temperature of 1300° to 1360° C. (2372° to 2480° F.) to dissolve the gamma prime phase in the matrix gamma phase, air cooling it to below a temperature of 800° C. (1472° F.), and again heating it to a temperature of 760° to 1100° C. (1400° to 2012° F.) to precipitate the gamma prime phase.

DETAILED DESCRIPTION OF THE PREFERRED EMBODIMENTS

The nickel-base single crystal superalloy in accordance with this invention will first be described. In the following description, all percentages are by weight.

The nickel-base single crystal superalloy of this invention has a composition consisting of 4.5 to 10% of Cr, 7.5 to 20% of W, 4.5 to 6% of Al, 2 to 12% of Ta, 5 to 10% of Co and the balance substantially being Ni, with the proviso that W+Ta=17 to 24% and W+Ta+Cr=22 to 30%.

In the superalloy of this invention, Cr serves to better the sulfidation resistance of the alloy. If the amount of Cr is less than 4.5%, this effect cannot be sufficiently obtained. If its amount exceeds 10%, topologically closed packed phases (TCP phases) such as a sigma phase or a mu phase occur in plate-like form to reduce the creep rupture strength of the alloy.

W dissolves in the gamma phase and the gamma prime phase to strengthen these phases. For this purpose, its amount should be at least 7.5%. If it exceeds 20%, deleterious precipitates such as the mu phase and an alpha-W phase form to shorten the creep rupture life of the alloy.

Al is an element essential to the formation of the gamma prime phase, and in order to precipitate the gamma prime phase, it should be included in an amount of at least 4.5%. If, however, its amount exceeds 6%, the amount of a coarse gamma prime phase called a eutectic gamma prime becomes excessively large, and the complete solutionizing of precipitated gamma prime becomes impossible and consequently, the creep rupture strength of the alloy is reduced.

Ta is an element necessary for solid solution strengthening of the gamma prime phase and increasing the volume fraction of the gamma prime phase. If its amount exceeds 12%, the amount of the eutectic gamma prime becomes excessively large, and the solutionizing treatment cannot be performed sufficiently. Consequently, the creep rupture strength of the alloy is reduced.

In order to obtain excellent creep rupture strength with the alloy of this invention, there are two requisite conditions in regard to certain elements. A first condition is that the total amount of W and Ta which are effective for solution strengthening of the gamma phase or the gamma prime phase should be in the range of 17 to 24%. If the total amount is less than 17%, the extent of solid solution strengthening is insufficient, and a sufficient creep rupture strength cannot be obtained. If, on the other hand, it exceeds 24%, deleterious precipitates such as the alpha-W phase and the mu phase form to reduce the creep rupture life of the alloy. A second condition is that the total amount of W, Ta and Cr should be 22 to 30%. If the total amount exceeds 30%, deleterious compounds such as the sigma phase and the mu phase form to reduce the creep rupture strength of the alloy. If the total amount is less than 22% by weight, the extent of solid solution strengthening is insufficient, and a sufficient creep rupture strength cannot be obtained.

If the amount of Co is less than 5%, the above-mentioned advantage is not obtained. If its amount exceeds 10%, deleterious phases such as the sigma phase form to reduce the creep rupture strength of the alloy in all temperature regions.

The process for producing the nickel-base single crystal superalloy of this invention will now be described in detail.

According to this invention, the nickel-base single crystal alloy can be produced by a process for producing a nickel-base single crystal superalloy, which comprises directionally solidifying a material having a composition consisting essentially of, by weight, 4.5 to 10% of Cr, 7.5 to 20% of W, 4.5 to 6% of Al, 2 to 12% of Ta, 5 10% of Co to and the balance substantially being Ni, said composition also satisfying the conditions of W+Ta=17 to 24% and W+Ta+Cr=22 to 30%, to form a single crystal alloy; heating the single crystal alloy to a temperature of 1300° to 1360° C. (2372° to 2480° F.) to dissolve the gamma prime phase in the matrix gamma phase; air cooling it to below a temperature of 800° C. (1472° F.); and again heating it to a temperature of 760° to 1100° C. (1400° to 2012° F.) to precipitate the gamma prime phase.

Since the nickel-base single crystal superalloy of this invention does not substantially have a grain boundary, it is not necessary to add intentionally grain boundary strengthening elements such as carbon, boron, zirconium and hafnium to the above material for the production of the nickel-base single crystal superalloy of this invention. The above material may contain small amounts of these elements as impurities. Preferably, however, the amounts of these elements are very small or zero.

The individual steps of the process of this invention will be described.

(A) Step of preparing a single crystal alloy by directional solidification

The directional solidifcation can be carried out by a method known per se, for example by the method described in U.S. Pat. No. 3,494,709. The directional solidification can convert the material having the above composition into a single crystal alloy.

(B) Step of solutionizing treatment

The single crystal alloy obtained in (A) is heated to dissolve the gamma prime phase in the gamma phase.

In the process of this invention, the solutionizing treatment can be carried out at a temperature of 1300° to 1360° C. (2372° to 2480° F.). If this temperature is lower than 1300° C. (2372° F.), it is difficult to dissolve the gamma prime phase completely and fine gamma prime precipitate are difficult to obtain by the subsequent aging treatment. As a result, a sufficient creep rupture strength is difficult to obtain. If the temperature exceeds 1360° C. (2480° F.), incipient melting tends to occur. Incipient melting drastically reduces the creep rupture strength of the alloy. To perform the solutionizing treatment completely, it is preferable to increase the heating time while the temperature is maintained within the aforesaid temperature range. Longer heating periods result in reduced segregation during solidification, and provide a homogeneous composition and increased creep rupture strength.

The heating time for the solutionizing treatment may be 0.5 to 50 hours or longer, preferably 0.7 to 10 hours, especially preferably 1 to 6 hours.

In the process of this invention, the solution temperature may be 1300° to 1360° C. (2372° to 2480° F.) According to U.S. Pat. No. 4,207,348, the solution temperature for Alloy 454 is 1288° to 1316° C. (2350° to 2400° F.), and U.S. Pat. No. 4,222,794 states that the solution temperature for Alloy 203E is 1341° to 1352° C. (2446° to 2466° F.). This shows that in the present invention, the solution temperature is higher, and wider in range, than in the prior art. This feature constitutes an excellent characteristic of the present invention. Since the high solution temperature brings about a high rate of diffusion of atoms constituting the alloy, the present invention can give a homogeneous composition within a short period of time. Furthermore, since the range of the solution temperature is wide in this invention, the temperature can be easily controlled.

(C) Air cooling step

After the solutionizing treatment, the alloy should be air cooled to below a temperature of not more than 800° C. (1472° F.), preferably not more than 780° C. (1436° F.), especially preferably not more than 760° C. (1400° F.) within a time period of, for example, 10 minutes, preferably 7 minutes, especially preferably 3 minutes. If the cooling rate is low, the gamma prime phase is coarsened during cooling, and fine gamma prime precipitate cannot be obtained by the subsequent aging treatment. Especially preferably, cooling is carried out to below 760° C. within 3 minutes.

(D) Aging step

The cooled alloy is then subjected to an aging treatment. The aging treatment can be carried out at 760° to 1100° C. (1400° to 2012° F.) If the aging temperature is lower than 760° C. (1400° F.), a longer priod of time is required to precipitate the gamma prime phase sufficiently, and this is disadvantageous to alloy production. If the temperature exceeds 1100° C. (2012° F.), the precipitated gamma prime phase becomes markedly coarsened, and the creep rupture strength of the alloy is reduced.

The aging time may be 1 to 100 hours or longer, preferably 2 to 72 hours. Particularly, to precipitate fine gamma prime precipitate in sufficient amounts, the aging time is preferably 3 to 48 hours. When the aging temperature is relatively high, for example 900° to 1100° C. (1652° to 2012° F.), the aging time is preferably within 20 hours, especially within 8 hours in order to prevent coarsening of the gamma prime phase. If the temperature is lower than 900° C. (1652° F.) the aging time is preferably at least 4 hours, especially at least 8 hours. Aging at relatively high temperatures and aging at relatively low temperatures may be performed combinedly.

The heat-treatment procedure consisting of the solutionizing treatment, air cooling treatment and aging treatment described above can give a single crystal superalloy containing fine gamma prime precipitate starting from the single crystal alloy obtained by directional solidification.

Examples 1 to 4 given below specifically illustrate the production of the nickel-base single crystal superalloy of this invention. In these examples, all percentages are by weight.

EXAMPLE 1

Production of single crystal alloy TMS-1 by the invention

A material composed of 7.5% Co, 5.5% Cr, 16.6% W, 5.2% Al, 5.1% Ta and the balance being Ni was directionally solidified to produce a single crystal alloy.

The directional solidification was carried out as follows:- The above material was melted in a vacuum induction furnace. The molten alloy was cast into a preheated mold with a selector between a starter part and a test piece resting on a copper chill plate. The mold is withdrawn at a rate of 200 mm (17.9 inches)/hr to produce directional freezing.

The single crystal alloy was heated for 4 hours in a heating furnace at 1348° C. (2458° F.) to form a solid solution. The high-temperature single crystal alloy subjected to the solution heat treatment was taken out from the heating furnace and air cooled to below 760° C. (1400° F.) over the course of 3 minutes. The cooled single crystal alloy was heated at 982° C. (1800° F.) for 5 hours, and again air cooled. It was further heated at 870° C. (1598° F.) for 20 hours, and then cooled in air.

The conditions for the above solutionizing treatment, air cooling treatment and aging treatment are referred to as "heat-treatment conditions A". The resulting single crystal alloy is designated TMS-1.

EXAMPLE 2

Production of TMS-2 by the invention

A single crystal alloy was produced in the same way as in Example 1 except that a material composed of 7.3% Co, 5.5% Cr, 18.6% W, 5.3% Al, 3.4% Ta and the balance being Ni was used. The resulting single crystal alloy is designated TMS-2.

EXAMPLE 3

Production of TMS-6 by the invention

A single crystal alloy was obtained as in Example 1 by directional solidification of a material composed of 9.2% Cr, 8.7% W, 5.3% Al, 10.4% Ta and the balance being Ni.

The single crystal alloy was heated at 1324° C. (2415° F.) for 4 hours in a heating furnace to form a solid solution. The high temperature single crystal alloy subjected to the solutionizing treatment was taken out from the heating furnace, and air cooled to below 760° 1 C. (1400° F.) over the course of 3 minutes. The cooled single crystal alloy was then heated at 982° C. (1800° F.) for 5 hours and air cooled. It was further heated at 870° C. (1598° F.) for 20 hours, and then air cooled.

The conditions for the above heat-treatment procedure including the solutionizing treatment, air cooling treatment and aging treatment are referred to as "heat-treatment conditions B". The resulting single crystal alloy is designated TMS-6.

EXAMPLE 4

Production of TMS-12 by the invention

A single crysgtal alloy was produced in the same way as in Example 1 except that a material composed of 6.6% Cr, 12.8% W, 5.2% Al, 7.7% Ta and the balance being Ni was used. The resulting single crystal alloy is designated TMS-12.

Table I represents a comparison of the compositions and the heat-treatment conditions of the alloys TMS-1, TMS-2, TMS-6 and TMS-12 of the invention produced as above with those of Alloy 454, Alloy 203E and NASAIR 100 obtained in accordance with the prior art.

The main differences of the composition of the nickel-base single crystal superalloy of this invention from those of the existing Alloy 454, Alloy 203 and NASAIR 100 are summarized below as can be seen from the data given in Table I and the appended claims.

1. Comparison of the composition of the alloy of the invention with that of Alloy 454:

(a) Alloy 454 contains Ti, whereas the alloy of the invention does not.

(b) Alloy 454 contains only 4.0% of W, whereas the alloy of the invention contains 7.5 to 20% of W.

2. Comparison of the composition of the alloy of this invention with that of Alloy 203E:

(a) Alloy 203E contains Ti, Mo, Re and V, whereas the alloy of the invention does not.

In other words, the number of alloy elements in the alloy of the invention is small, and the alloy of the invention is composed of only those elements which are normally contained in Ni-base superalloys. Since the alloy of the invention does not require expensive Re as is required in Alloy 203E, it can be produced at low cost.

(b) Alloy 203E contains only 5.0% of W, whereas the W content of the alloy of the invention is 7.5 to 20%.

3. Comparison of the composition of the alloy of the invention with that of NASAIR 100:

(a) NASAIR 100 contains Mo and Ti, whereas the alloy of the invention dos not.

(b) NASAIR 100 contains W and Ta in a total amount of 13.8%, whereas the total amount of W and Ta in the alloy of the invention is 17 to 24.

Measurement of the creep rupture lives at high temperatures of the single crystal alloys of the invention and calculation of the prior art single crystal alloys Test pieces prepared from the single crystal alloys produced in Examples 1 to 4 were tested to evaluate creep rupture life at a temperature of 1040° C. (1904° F.) under a stress of 14 kg/mm$^2$ (19.9 Ksi).

The creep rapture lives of Alloy 454, Alloy 203E and NASAIR 100 were calculated by extrapolating the measured values described respectively in U.S. Pat. No. 4,209,348, U.S. Pat. No. 4,222,794, and Superalloys 1980, pp. 215–224 into values for a temperature of 1040° C. (1904° F.) and a stress of 14 kg/mm$^2$ (19.9 Ksi).

In order to demonstrate the effect of the solutionizing treatment, air cooling treatment and aging treatment in this invention, the creep rupture life of a single crystal alloy (to be referred to as directionally solidified TMS-6) which had the same composition as TMS-6 of the invention but did not undergo heat-treatment under the heat treatment conditions B was also measured under the same test conditions as above.

TABLE I

| Alloy designation | Alloy composition (% by weight) the balance = Ni | | | | | | | | | | Heat treatment conditions (*) |
|---|---|---|---|---|---|---|---|---|---|---|---|
| | Co | Cr | Mo | W | Al | Ti | Ta | Others | W + Ta | W + Ta + Cr | |
| TMS-1 | 7.5 | 5.5 | — | 16.6 | 5.2 | — | 5.1 | — | 21.7 | 27.2 | A |
| TMS-2 | 7.3 | 5.5 | — | 18.6 | 5.3 | — | 3.4 | — | 22.0 | 27.5 | A |
| TMS-6 | — | 9.2 | — | 8.7 | 5.3 | — | 10.4 | — | 19.1 | 28.3 | B |
| TMS-12 | — | 6.6 | — | 12.8 | 5.2 | — | 7.7 | — | 20.5 | 27.1 | A |
| Alloy 454 | 5.0 | 10.0 | — | 4.0 | 5.0 | 1.5 | 12.0 | — | 16.0 | 26.0 | C |
| Alloy 203E | — | 5.0 | 2.0 | 5.0 | 5.5 | 1.1 | 6.5 | Re 3.0 V 0.4 | 11.5 | 16.5 | D |
| NASAIR 100 | — | 9.0 | 1.0 | 10.5 | 5.75 | 1.2 | 3.3 | — | 13.8 | 22.8 | E |

(*): The heat-treatment conditions were as follows:-
A: 1348° C. × 4 h, air cooling → 982° C. × 5 h, air cooling → 870° C. × 20 h, air cooling
   (2458° F.)                    (1800° F.)                      (1598° F.)
B: 1324° C. × 4 h, air cooling → 982° C. × 5 h, air cooling → 870° C. × 20 h, air cooling
   (2415° F.)                    (1800° F.)                      (1598° F.)
C: 1288° C. × 4 h, air cooling → 1080° C. × 4 h, air cooling → 870° C. × 32 h, air cooling
   (2350° F.)                    (1976° F.)                      (1598° F.)
D: 1346° C. × 4 h, air cooling → 1080° C. × 4 h, air cooling → 871° C. × 32 h, air cooling
   (2455° F.)                    (1976° F.)                      (1600° F.)
E: 1316° C. × 2 h + 1324° C. × 2 h, air cooling → 982° C. × 5 h, air cooling → 870° C. × 20 hr, air cooling
   (2401° F.)   (2415° F.)                        (1800° F.)                     (1598° F.)

Table II shows the measured creep rupture lives of the single crystal alloys of the invention in comparison with the calculated creep rupture lives of the prior art single crystal alloys.

TABLE II

| Alloy designation | Creep rupture life (hours) | Heat-treatment conditions |
|---|---|---|
| TMS-1 | 1751, 1354 | A |
| TMS-2 | 1707, 1598 | A |
| TMS-6 | 1827 | B |
| TMS-12 | 1920 | A |
| Alloy 454 | 440 | C |
| Alloy 203E | 400 | D |
| NASAIR 100 | 510 | E |
| Directionally solidified TMS-6 | 91 | Not heat-treated |

Table II shows that the nickel-base single crytal superalloys of this invention (TMS-1, TMS-2, TMS-6 and TMS-12) have a creep rupture life of 1300 to 2000 hours, whereas the existing nickel-base single crystal superalloys (Alloy 454, Alloy 203E and NASAIR 100) have a creep rupture life of as short as 400 to 510 hours. In other woreds, the nickel-base single crystal superalloys of this invention have a creep rupture life about 3 to 5 times as long as that of the existing nickel-base single crystal superalloys.

Table II also shows that the single crystal alloy having the same compositon as the nickel-base single crystal alloy of this invention but not heat-treated has a creep rupture life of only 91 hours.

The above results demonstrate that the heat-treatment procedure in the process of this invention is essential to the invention.

What is claimed is:

1. A nickel-base single crystal superalloy having high creep rupture strength at high temperatures, said superalloy being obtained by subjecting a single crystal alloy having a composition consisting essentially of, by weight,
   Cr 4.5–10%,
   W 7.5–20%,
   Al 4.5–6%,
   Ta 2–12%,
   Co 5–10%,
   Ni substantially being the balance,
   W+Ta=17–24%,
   W+Ta+Cr=22–30%,
to a solutionizing treatment, an air cooling treatment and an aging treatment.

2. The superalloy of claim 1 which has a creep rupture life, measured at a temperature of 1040° C. (1904° F.) under a stress of 14 kg/mm$^2$ (19.9 Ksi), of at least 700 hours.

3. The superalloy of claim 1 which has a creep rupture life, measured at a temperature of 1040° C. (1904° F.) under a stress of 14 kg/mm$^2$ (19.9 Ksi), of at least 900 hours.

4. The superalloy of claim 1 which has a creep rupture life, measured at a temperature of 1040° C. (1904° F.) under a stress of 14 kg/mm$^2$ (19.9 Ksi), of at least 1200 hours.

5. The superalloy of claim 1 which is obtained by subjecting a single-crystal alloy having a composition consisting essentially of, by weight,
   Cr 4.5–10%,
   W 7.5–20%,
   Al 4.5–6%,
   Ta 2–12%,
   Co 5–10%,
   Ni substantially being the balance,
   W+Ta=17–24%,
   W+Ta+Cr=22–30%,
to a solutionizing treatment at 1300° to 1360° C. (2372° to 2480° F.), an air cooling treatment to below 800° C. (1472° F.), and an aging treatment at 760° to 1100° C. (1400° to 2012° F.).

6. The superalloy of claim 5 which has a creep rupture life, measured at a temperature of 1040° C. (1904° F.) under a stress of 14 kg/mm$^2$ (19.9 Ksi), of at least 700 hours.

7. The superalloy of claim 5 which has a creep rupture life, measured at a temperature of 1040° C. (1904° F.) under a stress of 14 kg/mm$^2$ (19.9 Ksi), of at least 900 hours.

8. The superalloy of claim 5 which has a creep rupture life, measured at a temperature of 1040° C. (1904° F.) under a stress of 14 kg/mm$^2$ (19.9 Ksi), of at least 1200 hours.

9. The superalloy of claim 1 which is obtained by subjecting a singlg crystal alloy having a composition consisting essentially of, by weight,
   Cr 4.5–10%,
   W 7.5–20%,
   Al 4.5–6%,
   Ta 2–12%,
   Co 5–10%,
   Ni substantially being the balance,
   W+Ta=17–24%,
   W+Ta+Cr=22–30%,
to a solutionizing treatment at 1300° to 1360° C. (2372° to 2480° F.) 0.5 to 50 hours, an air cooling treatment to below 800° C. (1472° F.) within 10 minutes, and an aging treatment at 760° to 1100° C. (1400° to 2012° F.) for 1 to 100 hours.

10. The superalloy of claim 9 which has a creep rupture life, measured at a temperature of 1040° C. (1904° F.) under a stress of 14 kg/mm$^2$ (19.9 Ksi), of at least 700 hours.

11. The superalloy of claim 9 which has a creep rupture life, measured at a temperature of 1040° C. (1904° F.) under a stress of 14 kg/mm$^2$ (19.9 Ksi), of at least 900 hours.

12. The superalloy of claim 9 which has a creep rupture life, measured at a temperature of 1040° C. (1904° F.) under a stress of 14 kg/mm$^2$ (19.9 Ksi), of at least 1200 hours.

13. The superalloy of claim 1 which is obtained by subjecting a single crystal alloy having a composition consisting essentially of, by weight,
   Cr 4.5–10%
   W 7.5–20%,
   Al 4.5–6%,
   Ta 2–12%,
   Co 5–10%,
   Ni substantially being the balance,
   W+Ta=17–24%,
   W+Ta+Cr=22–30%,
to a solutionizing treatment at 1300° to 1360° C. (2372° to 2480° F.) for 1 to 6 hours, an air cooling treatment to below 760° C. (1400° F.) within 3 minutes, and an aging treatment at 760° to 1100° C. (1400° to 2012° F.) for 3 to 48 hours.

14. The superalloy of claim 13 which has a creep rupture life, measured at a temperature of 1040° C.

(1904° F.) under a stress of 14 kg/mm² (19.9 Ksi), of at least 700 hours.

15. The superalloy of claim 13 which has a creep rupture life, measured at a temperature of 1040° C. (1904° F.) under a stress of 14 kg/mm² (19.9 Ksi), of at least 900 hours.

16. The superalloy of claim 13 which has a creep rupture life, measured at a temperature of 1040° C. (1904° F.) under a stress of 14 kg/mm² (19.9 Ksi), of at least 1200 hours.

17. A process for producing a nickel-base single crystal superalloy, which comprises directionally solidifying a material having a composition consisting essentially of, by weight, Cr 4.5–10%,
W 7.5–20%,
Al 4.5–6%,
Ta 2–12%,
Co 5–10%,
Ni substantially being the balance,
W+Ta=17–24%,
W+Ta+Cr=22–30%, to form a single crystal alloy, heating the single crystal alloy to a temperature of 1300° to 1360° C. (2372° to 2480° F.) to dissolve the gamma prime phase in the matrix gamma phase, air cooling it to below a temperature of 800° C. (1472° F.), and again heating it to a temperature of 760° to 1100° C. (1400° to 2012° F.) to precipitate the gamma prime phase.

18. The process of claim 17 wherein the single crytal alloy is heated at 1300° to 1360° C. (2372° to 2480° F.) for 0.5 to 50 hours to dissolve the gamma prime phase in the matrix gamma phase, then air cooled to below 800° C. (1472° F.) within 10 minutes, and again heated at 760° to 1100° C. (1400° to 2012° F.) for 1 to 100 hours to precipitate the gamma prime phase.

19. The process of claim 17 wherein the single crystal alloy is heated at 1300° to 1360° C. (2372° to 2480° F.) for 0.7 to 10 hours to dissolve the gamma prime phase in the matrix gamma phase, then air cooled to below 800° C. (1472° F.) within 7 minutes, and again heated at 760° to 1100° C. (1400° to 2012° F.) for 2 to 72 hours to precipitate the gamma prime phase.

20. The process of claim 17 wherein the single crystal alloy is heated at 1300° to 1360° C. (2372° to 2480° F.) for 1 to 6 hours to dissolve the gamma prime phase in the matrix gamma phase, then air cooled to below 760° C. (1400° F.) within 3 minutes, and again heated at 760° to 1100° C. (1400° to 2012° F.) for 3 to 48 hours to precipitate the gamma prime phase.

21. The process of claim 17 wherein the single crystal alloy is heated at 1300° to 1360° C. (2372° to 2480° F.) to dissolve the gamma prime phase in the matrix gamma phase, air cooled to below 800° C. (1472° F.), further heated at 900° to 1100° C. (1652° to 2012° F.), and thereafter heated at 760° to 900° C. (1400° to 1652° F.) to precipitate the gamma prime phase.

22. The process of claim 21 wherein the single crystal alloy is heated at 1300° to 1360° C. (2372° to 2480° F.) for 0.5 to 50 hours to dissolve the gamma prime phase in the matrix gamma phase, air cooled to below 800° C. (1472° F.) within 10 minutes, further heated at 900° to 1100° C. (1652° to 2012° F.) for 0.5 to 30 hours, and thereafter heated at 760° to 900° C. (1400° to 1652° F.) for 0.5 to 70 hours to precipitate the gamma prime phase.

23. The process of claim 21 wherein the single crystal alloy is heated at 1300° to 1360° C. (2372° to 2480° F.) for 0.7 to 10 hours to dissolve the gamma prime phase in the matrix gamma phase, air cooled to below 800° C. (1472° F.) within 7 minutes, further heated at 900° to 1100° C. (1652° to 2012° F.) for 1 to 20 hours, and thereafter heated at 760° to 900° C. (1400° to 1652° F.) for 1 to 52 hours to precipitate the gamma prime phase.

24. The process of claim 21 wherein the single crystal alloy is heated at 1300° to 1360° C. (2372° to 2480° F.) for 1 to 6 hours to dissolve the gamma prime phase in the matrix gamma phase, air cooled to below 760° C. (1400° F.) within 3 minutes, further heated at 900° to 1100° C. (1652° to 2012° F.) for 1 to 10 hours, and thereafter heated at 760° to 900° C. (1400° to 1652° F.) for 2 to 38 hours to precipitate the gamma prime phase.

* * * * *